(12) United States Patent
Bayne et al.

(10) Patent No.: US 8,885,116 B2
(45) Date of Patent: Nov. 11, 2014

(54) BEZEL PACKAGING FOR SEALED GLASS ASSEMBLIES AND A GLASS ASSEMBLY THEREFOR

(75) Inventors: John Frederick Bayne, Elmira, NY (US); Yabei Gu, Painted Post, NY (US); Glenn Vertner Morgan, Horseheads, NY (US); Butchi Reddy Vaddi, Painted Post, NY (US); Jamie Todd Westbrook, Gillett, PA (US); Sujanto Widjaja, Corning, NY (US)

(73) Assignee: Corning Incorporated, Corning, NY (US)

( * ) Notice: Subject to any disclaimer, the term of this patent is extended or adjusted under 35 U.S.C. 154(b) by 873 days.

(21) Appl. No.: 12/922,987

(22) PCT Filed: Mar. 30, 2009

(86) PCT No.: PCT/US2009/001967
§ 371 (c)(1),
(2), (4) Date: Sep. 16, 2010

(87) PCT Pub. No.: WO2009/123696
PCT Pub. Date: Oct. 8, 2009

(65) Prior Publication Data
US 2011/0019351 A1 Jan. 27, 2011

Related U.S. Application Data

(60) Provisional application No. 61/072,472, filed on Mar. 31, 2008.

(51) Int. Cl.
*G02F 1/1333* (2006.01)
*H01L 51/52* (2006.01)

(52) U.S. Cl.
CPC .............. *G02F 1/133308* (2013.01); *H01L 51/5237* (2013.01)
USPC ............... 349/58; 349/158; 349/60; 349/153

(58) Field of Classification Search
CPC ....... G02F 1/16; G02F 1/1601; G02F 1/1607; G02F 1/133308; G02F 1/13; G02F 1/1303; G02F 1/1333

USPC ................ 349/58, 153, 122, 69, 158, 60, 84; 362/632, 633, 634, 362, 382; 361/679.01, 807, 809, 724, 752; 174/50.5; 312/223.2, 223.1; 248/223.31, 224.8, 231.81; 264/219; 348/E5.128, 790, 794

See application file for complete search history.

(56) References Cited

U.S. PATENT DOCUMENTS 5,479,285 A 12/1995 Burke .............................. 359/83
6,532,152 B1 * 3/2003 White et al. ................... 361/692

(Continued)

FOREIGN PATENT DOCUMENTS

EP 1814178 A2 1/2007
JP H09-080297 9/1995

(Continued)

OTHER PUBLICATIONS
Machine Translation of JP2002202729.

(Continued)

*Primary Examiner* — Thoi Duong
(74) *Attorney, Agent, or Firm* — Kevin M. Able (57) ABSTRACT

Methods and assemblies related to frame or bezel packaging of a sealed glass assembly, such as a fit-sealed OLED device, such as an OLED display panel. The frame or bezel packaging may have one or more of (a) rounded or chamfered corners, (a) a cover, (b) a reinforced lead edge, (c) openings or cutouts in the back panel to conserve material and lighten the bezel, and (d) a shock absorbent intermediate layer of low modulus of elasticity material applied between the sealed glass assembly and the back and/or sides of the frame or bezel. The frame or bezel design may include a gap between the sealed glass assembly and the back panel of the bezel. The gap may be filled at least in part with low modulus of elasticity backing material. The glass package may have one or more of (a) rounded or chamfered corners, (b) rounded or chamfered edges, (c) a low modulus of elasticity material applied around its periphery or portions of its periphery, such as on the corners only, (d) a shortened lead end, and (e) a thickened lead end.

33 Claims, 7 Drawing Sheets

(56) References Cited

U.S. PATENT DOCUMENTS

| | | | |
|---|---|---|---|
| 6,734,928 B2 | 5/2004 | Ito et al. | |
| 7,157,153 B2 | 1/2007 | Yamada et al. | 428/688 |
| 7,323,814 B2 | 1/2008 | Miyazaki et al. | 313/495 |
| 8,138,977 B2 * | 3/2012 | Zhang et al. | 343/702 |
| 2006/0044490 A1 | 3/2006 | Ichioka et al. | 349/58 |
| 2008/0067933 A1 | 3/2008 | Wang et al. | |
| 2008/0120946 A1 * | 5/2008 | Bayne et al. | 53/396 |

FOREIGN PATENT DOCUMENTS

| | | | |
|---|---|---|---|
| JP | H10-074583 | | 3/1998 |
| JP | 2001-051608 | | 2/2001 |
| JP | 2002202729 | | 7/2002 |
| JP | 2002215051 | | 7/2002 |
| JP | 2003-178876 A | | 6/2003 |
| JP | 2004-151551 | * | 5/2004 |
| JP | 2004151551 | | 5/2004 |
| JP | 2004151551 A | | 5/2004 |
| JP | 2007232802 | | 9/2007 |
| JP | 200877027 | | 4/2008 |
| KR | 20050070543 A | | 7/2005 |

OTHER PUBLICATIONS

Machine Translation of JP2002215051.
Machine Translation of JP2004151551.
Machine Translation of JP2007232802.
Machine Translation of JP200877027.
JP2011-502944 Office Action.
Japanese Office Action—Translated by Yanagida & Associates—dated Jun. 17, 2014.

* cited by examiner

BEZEL PACKAGING FOR SEALED GLASS ASSEMBLIES AND A GLASS ASSEMBLY THEREFOR

PRIORITY

This application claims priority to U.S. Patent Application No. 61/072,472, filed Mar. 31, 2008.

BACKGROUND

1. Field of Invention

The present invention relates to frames, mounts and/or bezels for packaging sealed flat-glass assemblies and for mounting such glass assemblies in end products, and to flat-glass assemblies for such frames, mounts or bezels. The flat-glass assemblies may be, for example, plasma, liquid crystal (LCD) or organic light emitting diode (OLED) display panels, in particular frit-sealed OLED display panels, or OLED lighting products.

2. Description of Related Art

Producing flat glass panel assemblies for plasma, LCD and OLED displays involves many challenges. A key requirement for such processes is the ability to package and mount the display panels in an end device in a manner that balances cost, performance, and durability. Displays based on organic light emitting diode (OLED) technology are particularly sensitive to many factors, such as to the diffusion of oxygen and moisture into the OLED display. In order for an OLED display panel to have a satisfactory lifetime, it must be hermetically sealed to prevent incursion of oxygen and moisture into the display panel, or must include getter material within the panel to absorb moister that does leak into the display.

One method for sealing an OLED display panel assembly is to seal the perimeter of the cover glass plate to the perimeter of the backplane glass plate with an epoxy or other polymeric adhesive. Such a polymeric seal is not hermetic and requires a getter material to be included within the display panel to absorb moisture that leaks through the polymeric sealing material, driving up the cost of manufacturing the display panel.

A method for hermetically sealing an OLED display panel, and thereby eliminating the need for getter material, is to seal the perimeter of the display panel or to encapsulate the OLED material with a glass frit sealing material. Glass frit is brittle, and is therefore susceptible to fracturing when the display panel is subjected to mechanical shock or bending, potentially breaching the hermetic seal. Impact and bending stresses may also cause or propagate a flaw along the edges of the glass plates of the assembly 1, which may eventually propagate into the frit-seal barrier and allow the penetration of moisture and oxygen into the assembly. Thus, there is a need to increase the structural integrity and durability of a frit sealed display panel or other glass assembly, by making it more resistant to mechanical shock and bending.

To protect against mechanical shock and bending, and other factors undermining the hermetically sealed glass panel's structural integrity, the assembly is typically packaged in a bezel, mount or frame, or combination of more than one of these, that provides a support structure and a protective shell for the glass assembly. As plasma, LCD and OLED display panels, and other hermetically sealed glass packages, continue to become larger with advances in technology and decreases in manufacturing cost, there is a need to further improve the packaging technology for such hermetically sealed glass assemblies.

SUMMARY OF THE INVENTION

In order to mitigate the potential for failure due to impact, an approach of the present invention is to re-design the bezel, mount, or frame that is used to hold the sealed display assembly. The bezel may ultimately be used as a main component for the final mounting of a functional display device in an end product.

According to one or more embodiments of the present invention, a material with a low elastic modulus may be applied to either the sealed glass assembly or the bezel, so that the material forms a shock absorbent intermediate layer between the sealed glass assembly and the bezel.

According to one or more embodiments of the present invention, a bezel may include a rectangular back wall with first, second, third and fourth peripheral edges; first, second and third sidewalls extending upward from the first, second and third peripheral edges respectively, with the sidewalls being joined together at two corners of the backwall. The bezel may be provided with at least one of (a) a reinforcing structure along the fourth peripheral edge of the backwall; (b) rounded corners; (c) chamfered corners; and (d) at least one opening through the backwall. Adhesive material may be provided on at least one of the sealed glass assembly and the bezel so that the adhesive secures the sealed glass assembly in the bezel and forms a shock absorbent intermediate layer between the sealed glass assembly and the bezel.

According to one or more embodiments of the present invention, a cover may be provided having a front wall with first, second, third and fourth peripheral edges, and first, second and third sidewalls extending upward from first, second and third peripheral edges respectively that may be attached to the first, second and third cover sidewall to the first second and third bezel sidewalls.

According to one or more embodiments of the present invention, an OLED device may be provided in the glass package. An opening may be formed in the cover front wall through which light emitted by the OLED device may pass.

According to one or more embodiments of the present invention, an adhesive may be applied to one of an inner surface of the bezel sidewalls and peripheral edges of the glass package opposing the bezel sidewalls, and the sealed glass assembly may be adhered in the bezel such that a gap is formed between the glass package and the bezel backwall.

According to one or more embodiments of the present invention, a shock absorbent intermediate layer of low modulus of elasticity material may be provided in the gap between the glass package and the backwall of the bezel. The material may be formed of foam, ceramic fiber cloth, low modulus of elasticity polymeric organic coating, a rubber o-ring around the perimeter of the glass package, a rubber o-ring adhered to bezel wall facing the edge of the glass package, and/or o-rings around pins close to each corner of the bezel that are part of the bezel, whereby the rubber O-rings contact the edges of the glass panel adjacent to the corner areas.

According to one or more embodiments of the present invention, at least one strip of adhesive may be applied to one of an inner surface of the bezel backwall and a bottom surface of the sealed glass assembly. There may be one or more strips of adhesive and the strips may be arranged in a generally ring shaped pattern. A shock absorbent intermediate layer of low modulus of elasticity material may be located between the glass package and the backwall of the bezel inside the ring of adhesive.

According to one or more embodiments of the present invention, a sealed glass assembly may be formed of first and second rectangular glass plates having one of rounded or chamfered corners. An element that is sensitive to at least one of moisture and the ambient atmosphere may be located between the first and second glass plates. A glass frit sealing material may extend between the first and second plates surrounding the element, thereby joining the first and second glass plates and substantially hermetically sealing the element in the glass package.

According to one or more embodiments of the present invention, the glass assembly may house at least one electronic device, such as a frit-sealed glass OLED display panel. The first glass plate of the assembly may be longer in one dimension than the second glass plate, whereby a portion of the first glass plate extends beyond the second glass plate a distance of about 5 mm. Electrical contacts may be located on the extending portion of the first glass plate. Electrical leads may extend from the electrical contacts on the extending portion, through the frit seal, to the at least one electronic device sealed within the frit seal without compromising the hermetic frit seal.

According to one or more embodiments of the present invention adhesive is located on one of an inner surface of the bezel sidewalls and peripheral edges of the glass package opposing the bezel sidewalls, and the sealed glass assembly is secured in the bezel whereby there is a gap between the glass package and the bezel backwall. A shock absorbent intermediate layer of low elastic modulus material may be located in the gap. The shock absorbent intermediate layer may span the gap, and may be adhered to the bezel backwall and to the sealed glass assembly. The shock absorbent intermediate layer may be formed of foam, ceramic fiber cloth and/or low modulus of elasticity polymeric organic coating.

According to one or more embodiments of the present invention the sealed glass assembly may be a frit-sealed glass OLED device.

According to one or more embodiments of the present invention shock absorbent intermediate layer may be formed of foam, ceramic fiber cloth and/or low modulus of elasticity polymeric organic coating.

According to one or more embodiments of the present invention the bezel may be formed of acrylate, plastic, composite material, aluminum, titanium alloy and/or stainless steel.

According to one or more embodiments of the present invention adhesive may be formed of adhesive tape, silicone type adhesive or other organic adhesive.

According to one or more embodiments of the present invention sealed glass assembly may be formed of first and second rectangular glass plates having at least two rounded or chamfered corners. The first glass plate being longer in one dimension than the second glass plate, whereby a portion of the first glass plate extends beyond the second glass plate. An element that is sensitive to heat and to at least one of moisture and the ambient atmosphere may be located between the first and second glass plates. A glass frit sealing material may extend between the first and second plates and surround the element, thereby joining the first and second glass plates and forming substantially hermetic seal. Electrical leads may be located on the extending portion of the first glass plate and extend through the frit seal to the at least one electronic device without compromising the hermetic seal.

According to one or more embodiments of the present invention the extending portion of the first glass plate of the glass assembly may extend beyond the second glass plate a distance that is about 0.1 to about 5% of the diagonal of the second glass plate.

According to one or more embodiments of the present invention, the first glass plate may thicker that the second glass plate.

According to one or more embodiments of the present invention, the glass assembly may include resilient reinforcing material at the junction of the first and second glass plates along the extending portion of the first glass plate, on the corners of the glass assembly, or along the entire peripheral edges of the glass assembly.

The various embodiments of the present invention improve the mechanical integrity and reliability of the sealed glass assemblies, such as frit sealed assemblies, by at least one of damping impact-induced high stresses and resisting bending forces that can lead to cracking and delamination of the assembly. The present invention also may enhance mechanical bonding between glass plates of a glass assembly, in addition to improving hermeticity offered by a frit-seal. protection of the hermetic seal, such as a frit seal.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, wherein like numerals indicate like elements, there are shown in the drawings simplified forms that may be employed, it being understood, however, that the invention is not limited by or to the precise arrangements and instrumentalities shown, but rather only by the issued claims. The drawings may not be rendered to scale, and the aspects of the drawings may not be rendered to scale relative to each other.

DETAILED DESCRIPTION OF THE PRESENT INVENTION

Figure 1A:
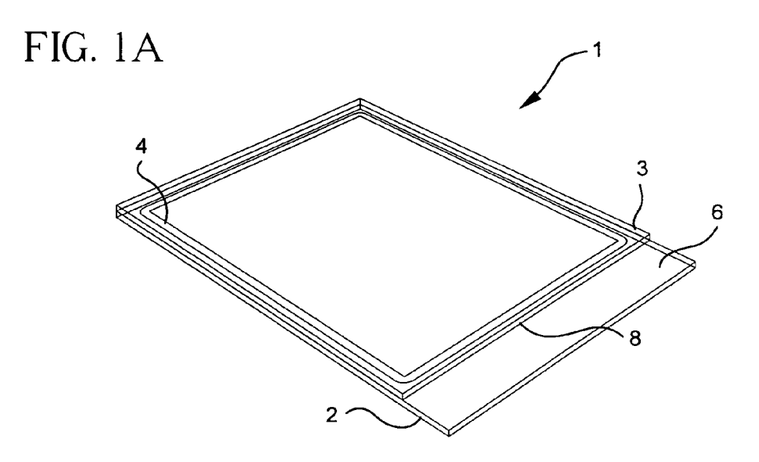
FIGS. 1A and 1B are illustrative isometric views of a prior art OLED frit-sealed device and a prior art bezel mount, respectively.

FIG. 1 illustrates a prior art sealed glass assembly or package 1, in particular, a hermetically sealed OLED glass assembly is manufactured by providing a first glass plate 2 and a second glass plate 3. Depositing organic light emitting diodes (not shown) on the first glass plate 2, depositing a polymeric or glass frit sealing material 4 on the second glass plate 3, and sealing the first and second glass plates together forming a sealed glass assembly.

Figure 1B:
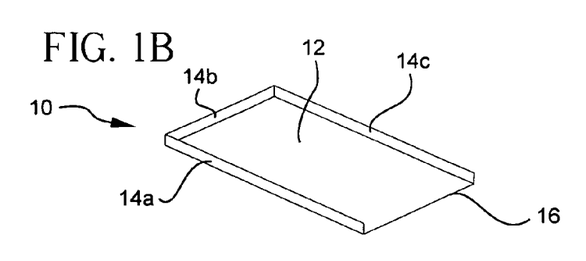

The first glass plate 2 may be longer in one direction than the second glass plate 3, such that a portion 6 of the first glass plate extends beyond the edge of 8 of the second glass plate. Electrical leads (not shown) for making electrical connections to the electrical device (not shown) in the glass package 1 may be placed on this extending portion (lead edge or extension) 6 of the first glass plate 2. An electrical connector or flexible cable (not shown) may then be connected to the leads on the extension or lead edge 6 for energizing and controlling the electrical device, such as an active matrix OLED display, sealed in the glass assembly 1. After being sealed, the glass assembly is typically inserted into a frame or bezel 10.

The frame or bezel 10 includes a back wall 12 and three sidewalls 14a, 14b, and 14c extending up from the back wall. There may be no edge wall at one end of the bezel, such that the bezel has an open edge 16. The lead edge 6 of the glass assembly 1 may be aligned with the open edge 16 of the bezel, such that an electrical connector in the end product can make contact with the leads on the lead edge 6 of the first glass plate 2. A layer of adhesive (not shown in FIG. 1), for example, double sided adhesive foam tape, is typically placed between the glass assembly and the bezel to firmly hold the sealed glass assembly in the bezel.

By way of example, the glass plates 2 and 3 may comprise CORNING INCORPORATED GLASS COMPOSITION Code 1737 or CORNING INCORPORATED GLASS COMPOSITION Code EAGLE 2000™ Eagle XG™ or Corning Jade™ glass, and any other glass substrates such as borosilicate and soda-lime glasses. These glass materials have numerous uses, in particular, for example, the production of displays, such as plasma, LCD and OLED displays.

Organic light emitting diodes have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). The OLED displays are known as being very bright and having a good color contrast and wide viewing angle. However, the OLED displays and, in particular, the electrodes and organic layers located therein, are susceptible to degradation from interaction with oxygen and moisture leaking into the OLED display from the ambient environment. The useful lifetime of the OLED display can be increased significantly if the electrodes and organic layers within the OLED display are hermetically sealed from the ambient environment preventing such degradation.

Historically, it was very difficult to create an effective hermetic seal for an OLED display. For instance, the hermetic seal should provide a barrier for oxygen ($10^{-3}$ cc/m$^2$/day) and water ($10^{-6}$ g/m$^2$/day). Moreover, the temperature generated during the sealing process should not damage the materials (e.g., electrodes and organic layers) within the OLED display. For instance, the OLED pixels located within 1-2 mm of the seal in the OLED display should not be heated to more than 100 degrees Celsius during the sealing process. In addition, the gases released during sealing process should not contaminate or degrade the materials within the OLED display. Lastly, the hermetic seal needs to enable electrical leads and connections to enter the OLED display.

A common way to seal an OLED display is to use various types of epoxies, inorganic materials and/or organic materials that form a hermetic seal after they are cured by application of ultra-violet light or heat to the sealing material. For example, Vitex systems manufactures and sells a coating under the brand name of Barix™, which is a composite based approach where alternate layers of inorganic materials and organic materials can be used to seal the OLED display. Although these types of seals usually provide acceptable mechanical strength, they can be very expensive and there are many instances in which they have failed to prevent the diffusion of oxygen and moisture into the OLED display. Another common way for sealing the OLED display is to utilize metal welding or soldering. However, the resulting seal is not durable in a wide range of temperatures because of the substantial differences between the coefficients of thermal expansions (CTEs) of the glass plates and metal in the OLED display. Moreover, the temperatures required to melt and seal metal welding or soldering tends to damage heat sensitive devices such as OLEDs.

Insofar as these commonly employed methods to seal display structures (such as using organic adhesives with a desiccant cavity) might not be effective to provide hermetic sealing for OLED structures, new sealing methods have been developed. One such non-epoxy-based method of fabrication of a hermetically sealed glass package involves using a glass frit sealing material.

A glass assembly having a glass frit seal may be made as set forth in commonly owned U.S. Pat. No. 6,998,776 to Aitken, et al. ("'776"). Using an OLED display as an example, the '776 patent describes a hermetically sealed glass package and method for manufacturing the hermetically sealed glass package. Basically, the hermetically sealed OLED display is manufactured by providing a first glass plate and a second glass plate, depositing OLEDs on the first glass plate, and depositing a frit onto the second glass plate. After combining the first and second glass plates with the OLEDs in between, an irradiation source (e.g., a laser, or other source of infrared light) is then used to heat and melt the frit. When cooled, the frit solidifies and forms a hermetic seal that bonds the first glass plate to the second glass plate and protects the OLEDs. The frit is a glass frit that may be doped with at least one transition metal to aid in absorption of the radiation and a filler to lower the coefficient of thermal expansion (CTE) of the frit to more closely match the CTE of the glass plates. Use of a laser enables the frit to be melted and form the hermetic seal, while avoiding thermal damage to the OLEDs located closely adjacent to the glass frit seal.

Due to the inherent brittle nature of the glass frit seal, the sealed glass assembly may be susceptible to damage when subjected to mechanical shock or bending. Experiments have shown that a force on the exposed lead edge of a typical sealed glass package/device results in a bending moment in the sealed glass package, that may cause cracking in the lower or first glass plate and seal separation forces at the opposite corner of the sealed glass package, possibly resulting in delamination and fracturing of the brittle seal. It has been found that failure due to lead edge impact or forces is a major source of seal failure.

In order to mitigate the potential for failure due to mechanical impact and bending, the present invention provides an improved bezel packaging to hold the sealed display assembly or panel. The bezel is used ultimately as a main component of the final packaging and subsequent mounting of a functional display panel into an end product. An example of such a bezel is disclosed in commonly owned U.S. patent application Ser. No. 11/594,487, filed on Nov. 8, 2006.

For purposes of the present discussion, the sealed device introduced below may be any sealed glass assembly, independent of the method of sealing. However, due to the brittle nature of a frit seal, emphasis is placed on frit-sealed glass packages, insofar as frit-sealed devices may be more sensitive to mechanical impact and bending at the seal. Hence, frit-sealed devices are more likely to benefit from the improved structural durability offered by the bezel packaging of the present invention. Unless otherwise indicated, the sealed devices of the following figures are interchangeable frit-sealed glass assemblies, such as frit-sealed OLED glass panels for use in OLED display or lighting panels. However, the invention is also applicable to other environmentally (such as moisture or oxygen) or heat sensitive components, such photovoltaic and other devices.

Figure 2:
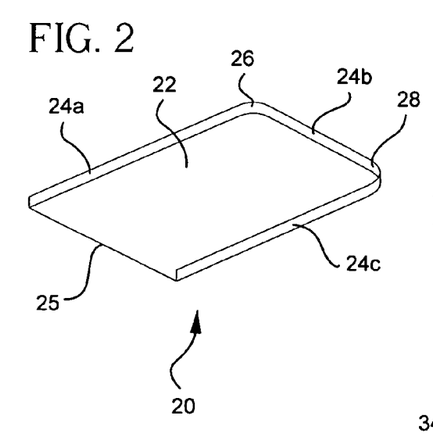
FIG. 2 is a diagrammatic isometric view of a first embodiment of a bezel mount according to the present invention with rounded corners.

Referring now to FIG. 2, which illustrates an exemplary first bezel 20 in accordance with the present invention. The bezel 20 includes a back wall 22 and three sidewalls 24a, 24b, and 24c extending up from the back wall. There may be no end wall at one end or edge of the bezel, such that the bezel has an open end or edge 25. The lead edge 6 of the glass package 1 (shown in FIG. 1) may be aligned with the open end 25 of the bezel, such that an electrical connector in the end product can make contact with the leads on the lead edge 6 of the first glass plate 2. A layer of adhesive (not shown), such as, for example, double foam tape, is typically placed between the glass assembly and the bezel to firmly hold the sealed glass assembly in the bezel.

The first bezel 20 includes rounded corners 26 and 28. Rounded corners 26 and 28 are stronger and more resistant to being crushed than the square corners of the bezel 10 of FIG. 1. Rounded corners also spread the impact of a mechanical shock or impact over a larger area than do sharp, square corners. AS a result, rounded corners are much more resistant to being damaged by a mechanical shock than are square corners. The rounded corners 26 and 28 should have as large a radius as possible. However, it will be appreciated that a decrease in the usable glass package area that results as the radius of the corners is increased will have to be balanced against the resulting increase in strength of the rounded corners 26 and 28. A corner radius in the range of 2-10 mm, or in the range of 0.1% to 5% of the glass assembly's or second glass plate's (or of the display area in the case of a display panel) diagonal measurement has been found to be advantageous.

The bezel 10, 20, 30, 40, 50, 70, may advantageously be formed of a relatively light, strong and stiff or rigid material that is able to absorb impact energy, for example metals with a modulus of elasticity of about 50 GPa to about 250 GPa, or about 60 GPa to about 200 GPa, such as aluminum, stainless steel, cast iron; alloys a modulus of elasticity of about 100 GPa to about 400 GPa, or about 200 GPa to about 400 GPa, such as a titanium alloys; hard plastics a modulus of elasticity of about 0.1 GPa to about 10 GPa, or about 0.5 GPa to about 5 GPa, such as Acrylonitrile butadiene styrene (ABS), acrylates and Teflon; and composites a modulus of elasticity of about 5 GPa to about 400 GPa, or about 60 GPa to about 300 GPa, such as metal composites and polymer composites such as graphite fiber reinforced plastics such as ABS. The density of a metal bezel material may be about 8000 Kg/m$^3$, or form about 1000 Kg/m$^3$ to about 4000 Kg/m$^3$. The bezel design may include a commonly available frame made through a low-cost manufacturing process such as metal stamping or injection molding. A bezel manufactured through injection molding or stamping processes may be advantageously cost-effective and yet shock-resistant. Naturally, the concept of shock absorption denotes different levels of rigidity and modulus values when applied to the bezel than when applied to the intermediate shock absorbing backing material, as demonstrated by the exemplary materials for each. Form a purely structural standpoint, a thicker bezel wall is stronger, but thickness must be balanced against increased size, weight and cost.

Figure 3:
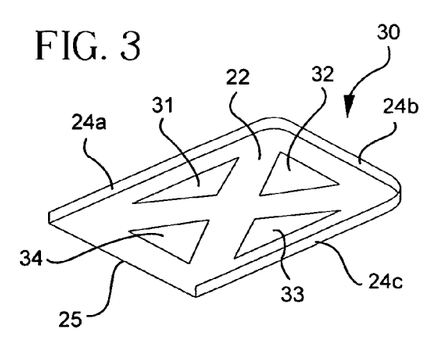
FIG. 3 is a diagrammatic isometric view of a modified version of the bezel mount of FIG. 2 with cutouts in the back panel.

FIG. 3 illustrates an exemplary second bezel 30 in accordance with the present invention. The second bezel 30 has large radius corners 26 and 28 like the first bezel 20, plus cutout areas 31, 32, 33 and 34 in the back wall 22 of the bezel 30. The use of cutouts 31 to 34 decreases the amount of material required to manufacture the bezel, resulting in a lighter and lower cost bezel. It will be appreciated that while four triangular cutouts are illustrated, the cutouts may vary in number, size and shape. The cutouts may also be employed in a bezel with squared, as opposed to rounded, corners.

Figure 4:
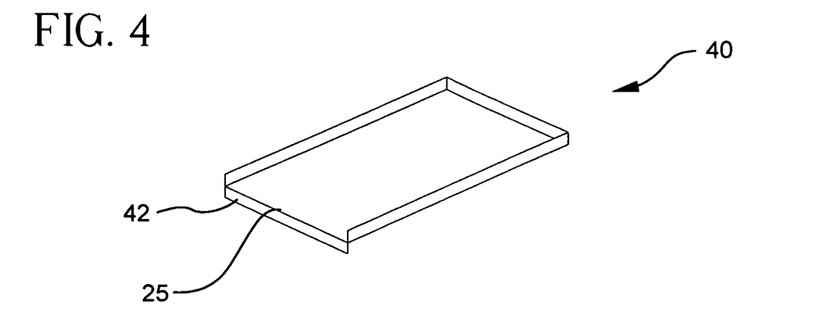
FIG. 4 is a diagrammatic isometric view of a bezel mount according to the present invention with a stiffening structure on the open electrical lead edge of the bezel.

FIG. 4 illustrates an exemplary third bezel 40 in accordance with the present invention. The third bezel 40 includes reinforcing structure 42 on the open end or edge 25 of the bezel. The reinforcing structure is illustrated as an integral flange or wall extending downward from the open end or edge 25 of the bezel. However, it will be appreciated that the reinforcing structure may be any suitable structure that provides stiffness or rigidity to the open end of the bezel. For example, the reinforcing structure may be integrally formed with the bezel or frame during molding or by bending the edge over, or a separate rod or plate may be adhered or otherwise attached to the back wall 22 along the open edge or end 25 of the bezel 40. The third bezel 40 may be used in combination with the rounded corners and/or cutouts of the first and second exemplary bezels 20 and 30.

Figure 5A:
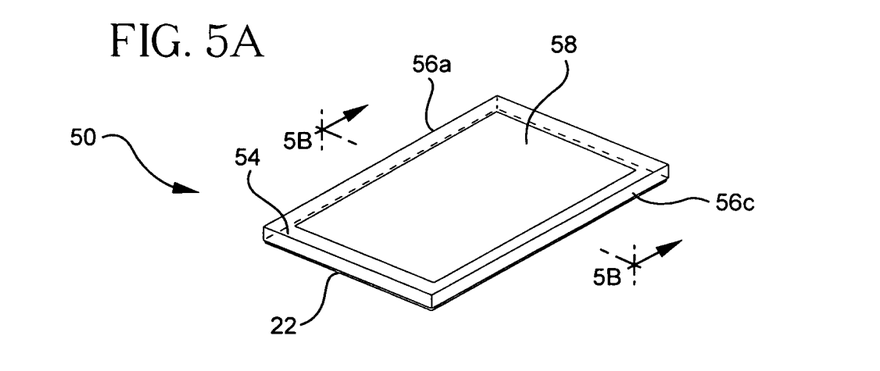
FIGS. 5A and 5B are diagrammatic isometric and cross-sectional views, respectively, of a bezel mount according to the present invention with a top cover.
Figure 5B:
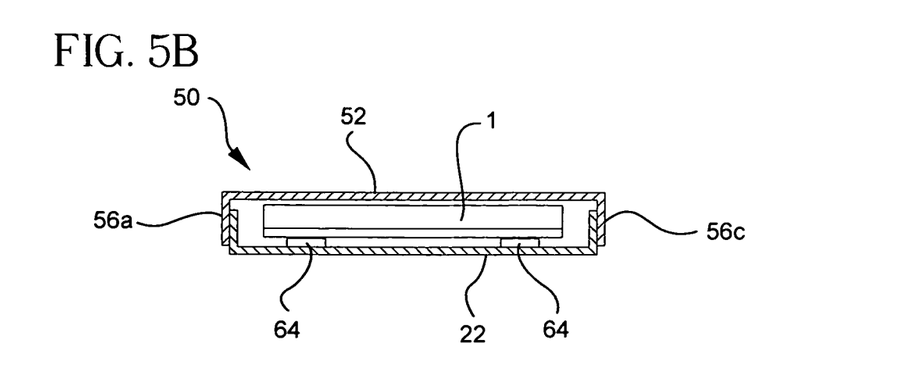

FIGS. 5A and 5B illustrate an exemplary fourth bezel 50 in accordance with the present invention. The fourth bezel 50 includes a cover 52. The cover 52 may include a top or front wall 54, integral sidewalls 56a, 56b, and 56c extending downward from the front wall and an opening 58 in the front wall. In the case that the glass assembly is a display panel, the display may be viewed through the opening 58 in the front wall of the cover. The sidewalls 56a, 56b, and 56c overlie and may be attached to the sidewalls 24a, 24b and 24c extending up from back wall 22 of the bezel. The sidewalls 56a, 56b, and 56c may be attached to sidewalls 24a, 24b and 24c by any suitable means (not shown), such as by, for example, adhesive, welding, or by integrally or separately formed clips or separate fasteners.

The cover 52 serves to reinforce the bezel 50, by reinforcing the sidewalls and providing a partial cover for the glass assembly 1. The fourth bezel 50 may include the rounded corners, cutouts and/or reinforcing structure of the first, second, and third exemplary bezels 20, 30 and 40. The fourth bezel may also include resilient shock absorbent support pads or backing material 64 on the back wall 22 for resiliently supporting the glass assembly and isolating it from the bezel.

The resilient backing material 64 may be formed of any suitable resilient material, such as, for example, a layer of low modulus of elasticity polymeric material, such as rubber, organic polymeric adhesive or Corning CPC6™ acrylate, polymer, such as polyurethane or polyether-based, adhesive foam tape, resin, such as silicone gel or epoxy, ceramic fiber cloth, fabric or paper, e.g., alumino silicate fiber cloth, a component of Fiberfrax™ cloth or paper, and may have a thickness of about 0.005-0.1 inches (about 0.0127-0.254 cm). The resilient backing material 64 may be an adhesive material or a non-adhesive material with or without and adhesive applied thereto. Adhesive serves to adhere the glass assembly to the bezel, thereby further securing the glass assembly within the bezel and strengthening the overall assembly. Suitable adhesives are described below in relation to the adhesive 62a in FIG. 7B.

The selected backing material 64 should have a low enough elastic modulus, such as from about 0.01 GPa to about 100 GPa, to provide shock absorbing/impact resistant properties and be of adequate thickness to allow activation of the shock absorbing properties, which depends on the modulus of elasticity of the material. For instance, the modulus of elasticity of a fiber cloth material may be in the range of about, 1-100 GPa, about 1-50 MPa, about 2-25 MPa, or about 5-20 MPa, and a thickness of about 0.001-0.025 inches. A polymeric material may have a modulus of elasticity in the range of about 0.01 GPa-20 GPa, about 0.1-1 GPa, or about 0.05-0.5 GPa. The backing material 64 should be able to withstand the temperature rise due to the accumulated heat generated by the device 1 during operation and use. For example, backing material may include various commercially available foam materials, or both rigid and flexible foam or epoxy. The bezel 10, 20, 30, 40, 50, 70 and backing material 64 advantageously would be electrically non-conducting.

Figure 6:
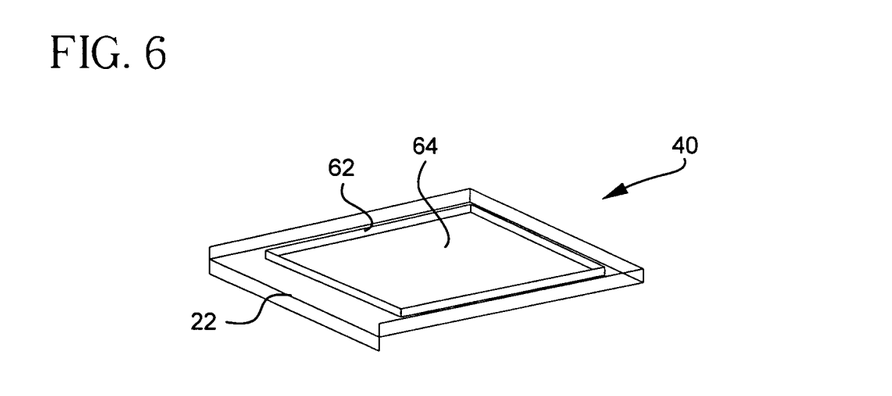
FIG. 6 is a diagrammatic isometric view of a bezel mount according to the present invention with adhesive and a foam support on the back panel for mounting and supporting a display panel in the bezel.

Any shape/geometry of the backing material 64 is acceptable to provide the function of supporting the sealed device 1 and isolating it from the bezel. The backing material 64 may be one or more separate beads, strips or pads of material that are applied between the glass assembly and the bezel in any suitable manner, or it may be a coating of one or more layers of elastic material applied to the back wall 22 of the bezel or to the glass assembly 1. The backing material may substantially cover all of the surface(s) of the glass assembly 1 that adjoins the bezel, or it may cover just a portion of this surface(s). FIG. 6 illustrates the exemplary third bezel 40 with an adhesive 62 on the back wall 22 for securely fixing the glass assembly 1 (not shown in FIG. 6) within the bezel 40 and, similar to FIG. 5B, a resilient shock absorbent support pad or backing material 64 on the back wall 22 for resiliently supporting a central portion of the glass assembly and isolating the glass assembly from the bezel. The resilient pad or backing material 64 may be formed of adhesive or have adhesive applied thereto, such that it adheres to the bezel and the glass assembly, thereby further securing the glass assembly within the bezel and strengthening the overall assembly.

Figure 7A:
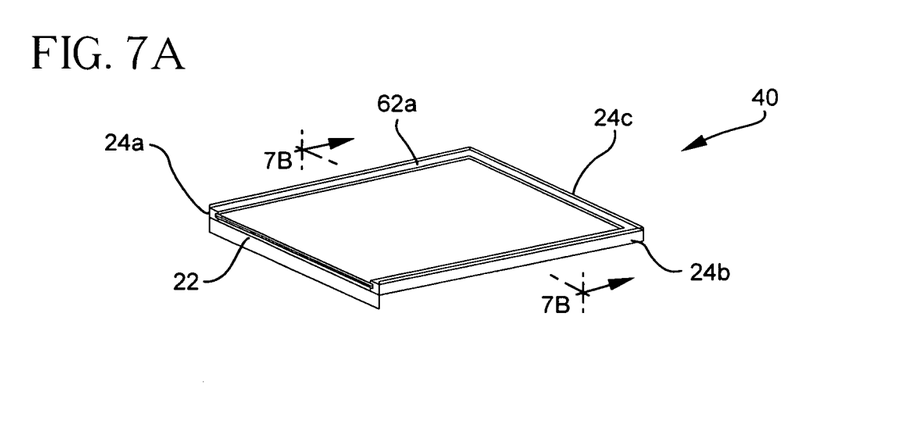
FIGS. 7A and 7B are diagrammatic isometric and cross-sectional views, respectively, of a bezel mount according to the present invention with an adhesive on the inside of the side walls for mounting and supporting the display panel in the bezel.
Figure 7B:
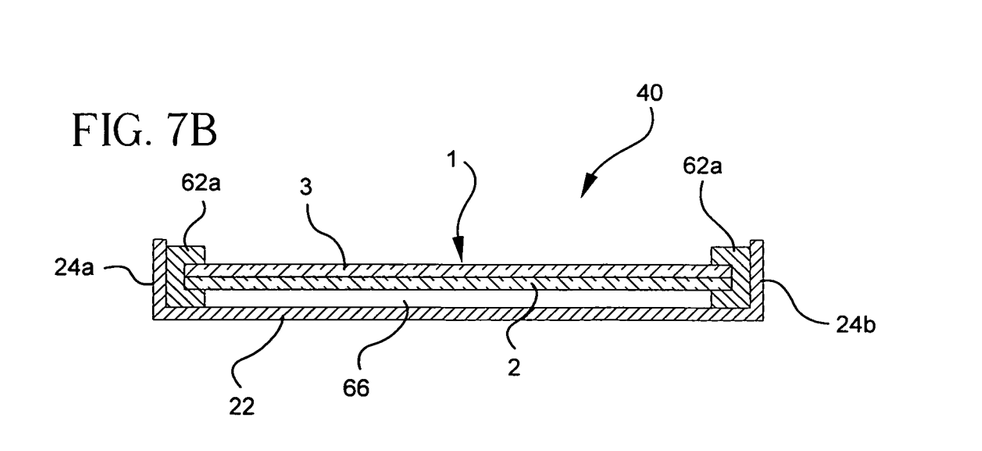

FIGS. 7A and 7B illustrate the exemplary third bezel 40 with an adhesive 62a on the side walls 24a, 24b and 24c for securely fixing the glass assembly 1 (not shown in FIG. 7A) within the bezel. Alternatively, a rubber o-ring (not shown) may be adhered around the perimeter of the glass package or adhered to bezel wall facing the edge of the glass package. The glass assembly 1 may be spaced from and suspended/floated over the back wall 22 by the adhesive 62a, defining a gap 66 between the glass assembly and the bezel backwall. During any impact or bending of the product in the field, the tolerance provided by the gap 66 between the sealed glass assembly 1 and bezel 40 serves to isolate the glass assembly 1 from contacting the bezel 40, thereby eliminating any resulting contact stresses on the glass assembly. In one or more embodiments, an exemplary gap may be equal to or less than about 0.1 inches (0.254 cm), or from about 0.1 cm to about 0.5 cm.

The adhesive 62, 62a may be, for example, a polymeric adhesive, such as SORBOTHANE® polymer, a silicone gel, epoxy, such as UV3000™, acrylate, elastomers such as butyl rubber, polybutadiene, styrene-butadiene, nitrile rubbers, chloroprene-based rubbers, and saturated rubbers such as ethylene propylene rubber, epichlorohyddrin rubber, polyacrylic rubber, silicone-based rubber, fluoroelastomers, polyether block amides, ethylene vinyl acetates, or double sided foam tape.

If an organic adhesive is used it is may he advantageous for the organic material to exhibit a low modulus of elasticity, set at room temperature without the application of external heat, and have acceptable moisture resistance/weathering properties. Such an organic adhesive or backing material may have a modulus of elasticity in the range of about 0.01 GPa to about 20 GPa, about 0.01 to about 10 GPa, or about 0.01 to about 5 GPa, about 0.01 GPa to about 2 GPa, or 0.01 to about 1 GPa and may be a polymer, such as polyether and polyurethane based thermoset, resin, such as silicone, epoxy, such as UV3000™, plastic foam, such as polystyrene foam, or rubber, such as styrene-butadiene rubber and chloroprene. If the selected organic adhesive requires UV-curing, then it may be advantageous for the adhesive to reside only outside the sealant epoxy or frit line. Such an arrangement may help minimize the risk that low-power density UV light curing of the organic adhesive will cause thermal damage to the device sealed within the glass assembly 1, such as, for example, the OLED material of an OLED device. Such curing process advantageously would stay below 80° C. for the few seconds of exposure.

By spanning the edges of the two glass plates, the application of the adhesive 62a strengthens the mechanical bond between the two glass plates 2 and 3 of the glass assembly 1. The adhesive may also penetrate into the gap existing between the two glass plates outside of the sealing epoxy or frit line 4, through capillary forces or by application, providing further strengthening of the bond between the glass plates.

A resilient shock absorbent support pad or backing material 64 (as shown in FIG. 6) may be included in combination with the adhesive 62a on the sidewalls. The backing material 64 may be located on the back wall 22 or on the glass assembly 1, and may partially or completely fill the gap 66. The backing material may, for example, be an organic adhesive that fills the gap 66 a foam pad coated with adhesive. The application of the backing material 64 may provide enhanced mechanical bonding between the two glass substrates 2 and 3 of device 1, as previously described in relation to FIG. 6.

Figure 8A:
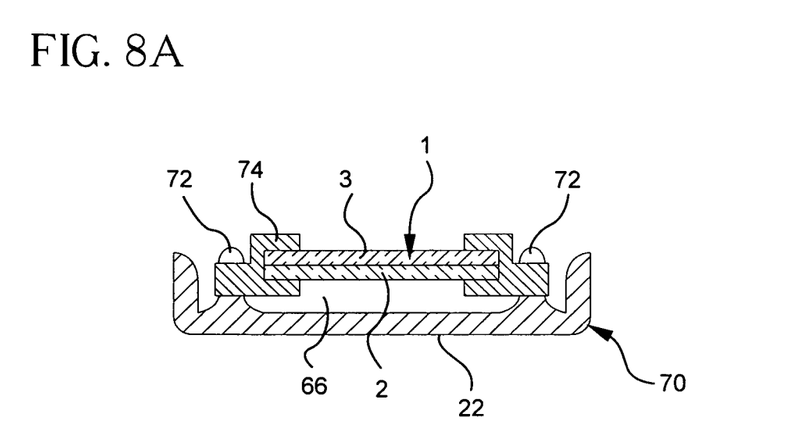
FIGS. 8A and 8B are diagrammatic cross-sectional views of embodiments of a bezel mount according to the present invention with a suspended/floating mounting of the display panel.
Figure 8B:
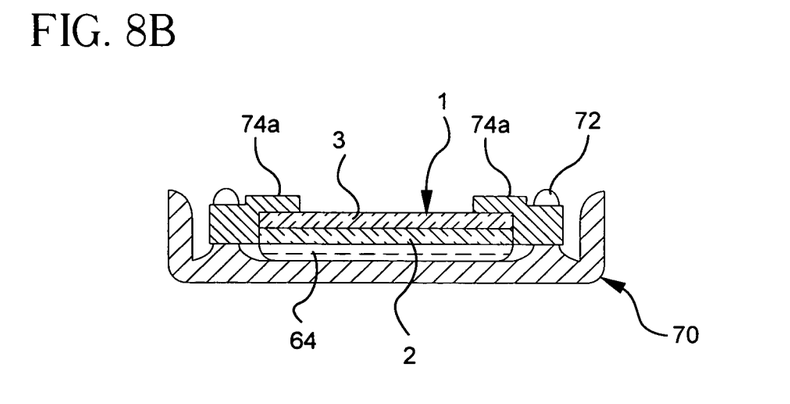

FIGS. 8A and 8B illustrate an exemplary fifth bezel 70 that includes alternative structure that may be employed for mounting the glass assembly 1 in the bezel 70 such that the glass assembly is spaced from and suspended over the back wall 22 of the bezel 70. The fifth bezel 70 includes mounting elements 72. The mounting elements 72 receive flexible mounting structures 74, 74a affixed to the edges of the glass assembly 1. The glass assembly 1 may be mounted on the mounting elements 72 such that it is spaced from and suspended over the back wall 22 of the bezel as illustrated in FIG. 8A forming a gap 66 there between. Alternatively, as shown in FIG. 8B, the glass assembly 1 may be supported by a resilient backing material 64 that is affixed to the glass assembly 1 or to the back wall 22 within the gap 66 between the glass assembly and the bezel.

Mounting structures 74 and 74a may be formed of any suitable tear resistant flexible material, such as, for example, carbon-fiber reinforced rubber or soft plastic, such as a low density polyethylene or polypropylene, and may be molded onto or adhered to the edges of the glass assembly 1. The mounting elements 72 may take the form of posts/pins, flanges, or other suitable structure, and may be barbed or include one or more grooves in their sides (not shown) for securely retaining the mounting structures 74 and 74a on the mounting elements. Alternatively, rubber o-rings (not shown) around pins provided on the frame or bezel adjacent to each corner of the bezel, such that the rubber O-rings contact the edges of the glass assembly adjacent to the corner of the glass assembly.

Figure 11:
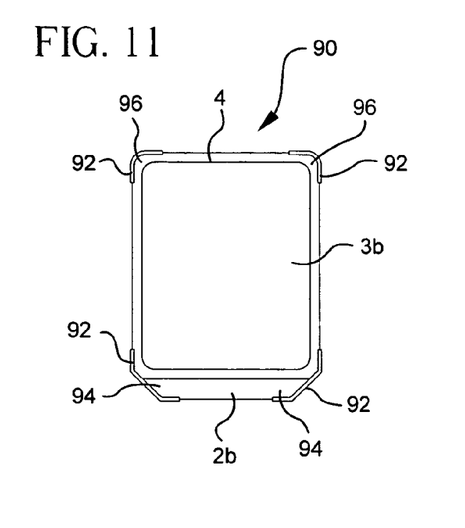
FIG. 11 is diagrammatic top view of a glass display panel according to the present invention with protective material on just the corners of the display panel.
Figure 12:
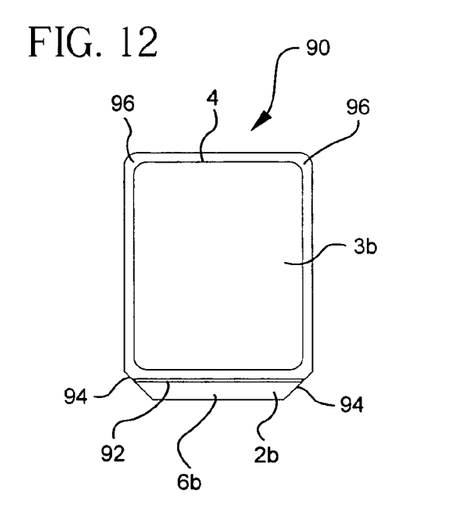
FIG. 12 is diagrammatic top view of a glass display panel according to the present invention with protective material on just the junction of the glass plates at the lead edge of the panel.
Figure 13:
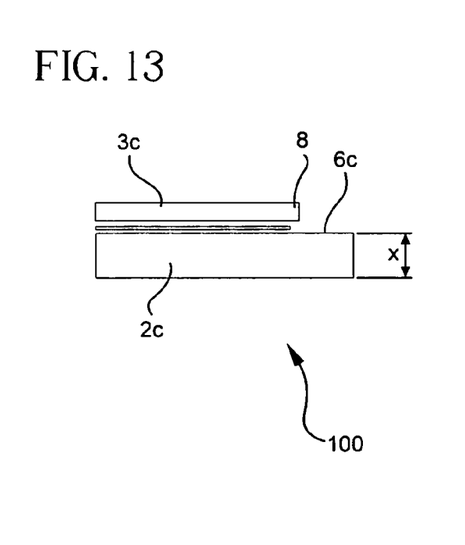
FIG. 13 is diagrammatic partial side view of a glass display panel according to the present invention with a thickened back plane/first glass plate.
Figure 14:
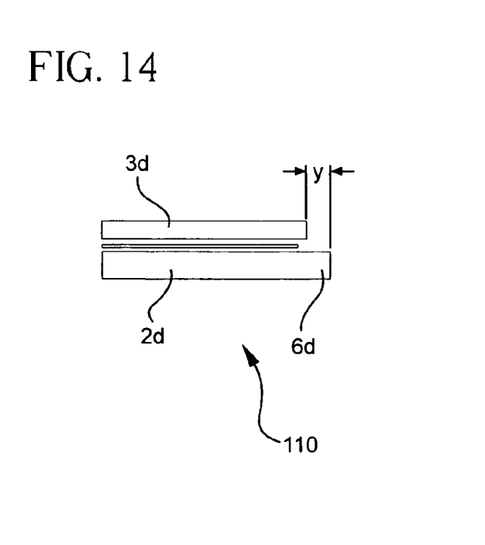
FIG. 14 is diagrammatic partial side view of a glass display panel according to the present invention with a shortened back plane/first glass plate.

Referring now to FIGS. 9 through 14, the present invention also provides enhancements to the glass assembly 1 for improving the mechanical shock resistance and durability of the glass assembly. More particularly, FIGS. 9 through 12 illustrate aspects of the present invention that include at least one of a protective material or coating applied to the edges of the glass assembly and modified glass plates. FIGS. 13 and 14 illustrate aspects of the present invention that provide for modified glass plates 2 and 3 for the glass assembly.

Figure 9:
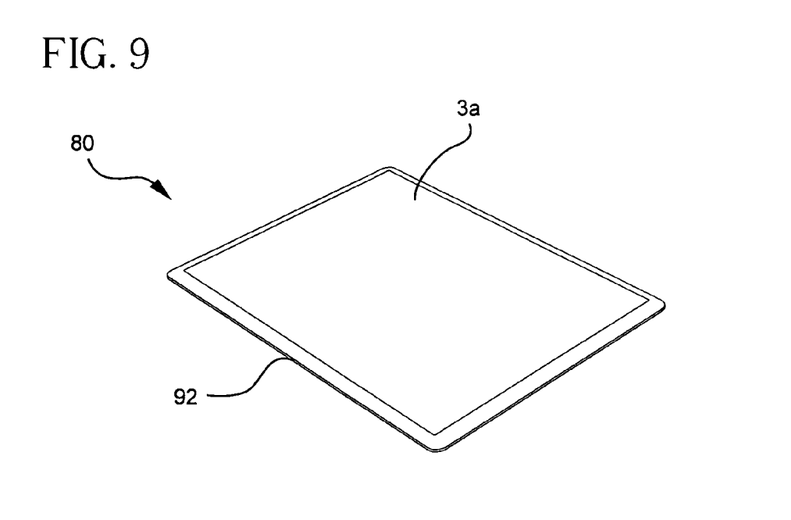
FIG. 9 is diagrammatic isometric view of a glass display panel according to the present invention with rounded corners and rounded edges.
Figure 10A:
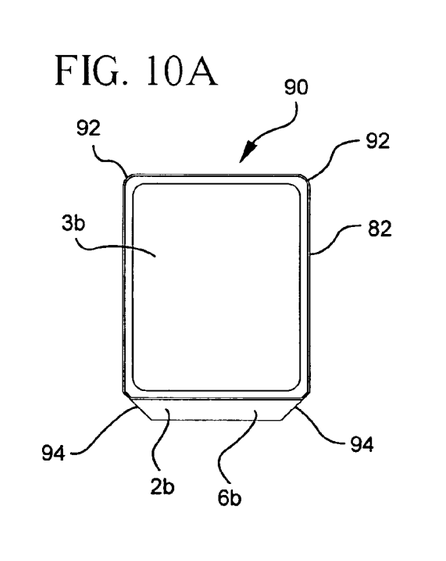
FIGS. 10A and 10B are diagrammatic isometric and partial side views, respectively, of a glass display panel according to the present invention with rounded and chamfered corners and protective material around the peripheral edges of the display panel.
Figure 10B:
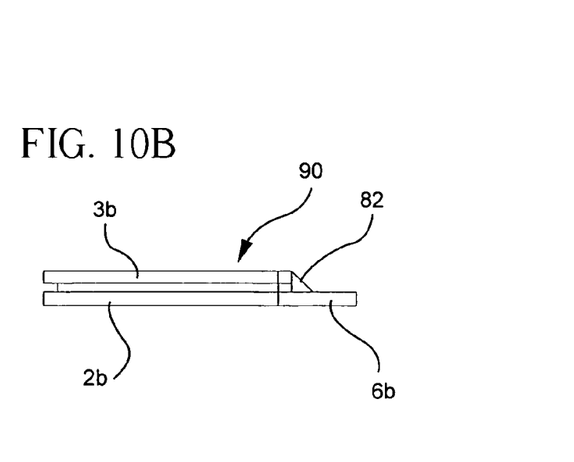

FIGS. 9, 10A and 10B illustrate glass assemblies 80 and 90 according to one aspect of the present invention, in which protective material 92 is applied to the entire periphery of the glass plates 2 and 3. FIG. 11 illustrates another aspect of the present invention, in which the reinforcing material 92 is applied only to the corners of the glass assembly 90, which are the portions of the assembly most vulnerable to mechanical impact forces. FIG. 12 illustrates a further aspect of the present invention, in which the reinforcing material 92 is applied only to the junction of the glass plates 2b and 3b at the lead end 6b of the assembly (also see FIG. 10B). This portion of the glass assembly is the most likely to incur a direct mechanical impact, because the lead edge of the glass assembly is purposefully left partially exposed when the glass assembly is mounted within the bezel in order to provide access to the lead edge by electrical connectors.

The reinforcing material 92 may advantageously be formed of a resilient shock absorbing material in order to protect the edges of the glass plates from mechanical impact forces and shocks and may be formed of the same material as the adhesive 62, 62a. The reinforcing material also serves to inhibit the initiation and propagation of fractures at imperfections or defects that may be present at the edges of the glass plates when the glass assembly is subjected to mechanical impacts and bending. For example, the glass plates are typically scored and broken from larger glass plates, which inevitably results in small fractures and defects in the scored and broken edges of the glass plates.

FIG. 9. illustrates an exemplary modified first glass assembly 80 according to an aspect of the present invention that has two glass plates 2a (not shown) and 3a of equal size and shape. With this construction, the entire assembly is formed of a double glass pane construction.

The exemplary modified second glass assembly 90 of FIG. 10A has a first glass plate 2b that is longer than the second glass plate 3b to form a lead edge 6b of the assembly, as in FIG. 1, except that the corners of the glass plates are either chamfered (corners 94) or rounded (corners 96). It will be appreciated that all four corners of the glass assembly may be either rounded or chamfered.

FIG. 13 illustrates another aspect of the present invention. An exemplary modified glass assembly 100 is illustrated that includes a thickened or a relatively thick first glass plate 2c. A typical first glass plate may have a thickness of about 0.2 mm to 0.7 mm. Whereas the relatively thick first glass plate of this aspect of the present invention may have a thickness X of about 0.2 mm to 5.0 mm.

FIG. 14 a further aspect of the present invention. An exemplary modified glass assembly 110 is illustrated that includes a shortened or relatively short first glass plate 2d, thereby providing a relatively short extension of lead edge or extension 6d. A typical length of first glass plate 2d may be about 20 to 70 mm. Whereas the relatively short first glass plate 2d of this aspect of the present invention may only be about 2 mm to 6 mm longer than the second glass plate 3d, thereby providing a relatively shorter lead edge 6d compared to a typical lead edge.

As previously discussed, the lead portion of the glass assembly is not entirely protected when the glass assembly is mounted in the bezel, but is partially exposed for access by electrical connectors. This, combined with the fact that there is only a single layer plate of glass in the lead portion 6c of the assembly, causes the lead portion to be more susceptible to damage by mechanical impact or bending forces than the rest of the glass assembly. Thickening or shortening the first glass plate serves to strengthen the lead portion 6c of the first glass plate that extends beyond the second glass plate 3c. This serves to inhibit breaking, chipping or shearing off of the lead edge caused by an impact, pressure or bending moment on the lead edge. This also serves to inhibit an opening or separation of the two glass plates caused by an impact, pressure or bending moment on the lead edge, and the resulting separation of the hermetic seal.

Figure 15:
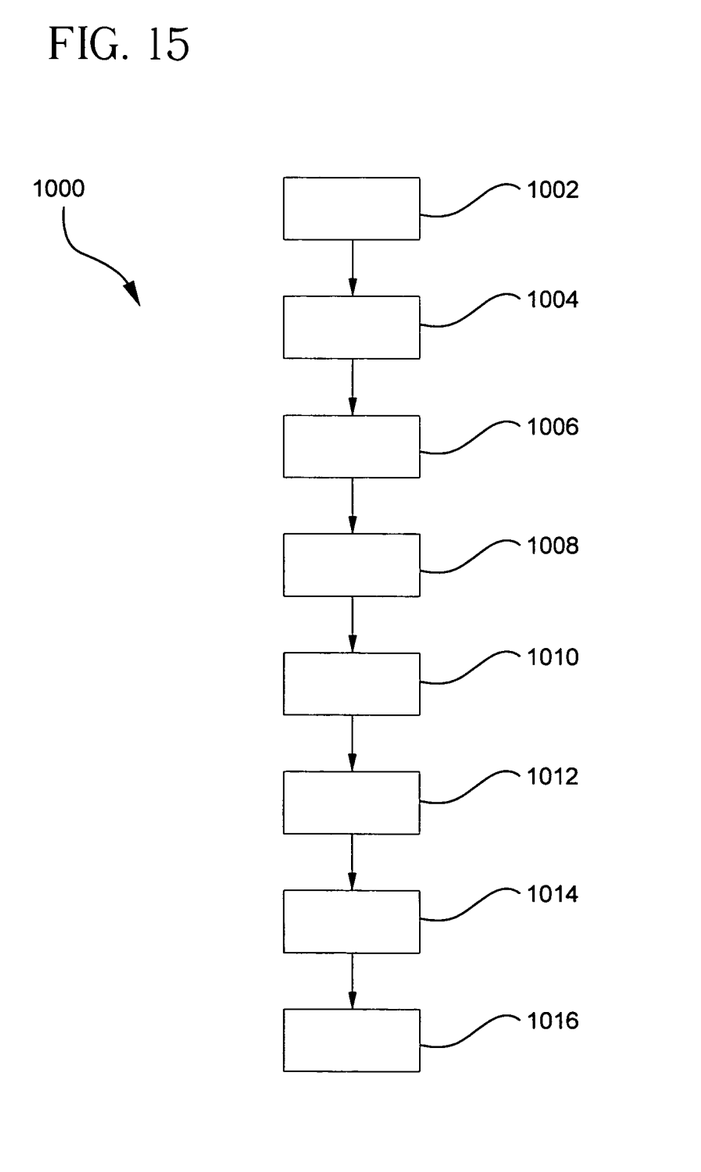
FIG. 15 is a block diagram of an exemplary process for producing a bezel and a glass package according to the present invention.

Referring to FIG. 15, a flow diagram illustrates process actions that may be carried out to package sealed glass assemblies in accordance with one or more embodiments of the present invention. An exemplary assembly process 1000 may include some or all of the following actions. The order of the actions is somewhat discretionary and within the skill of a person of ordinary skill in the art to determine, according to the parameters of the desired final product.

In action 1002 of process 1000, a bezel 10, 20, 30, 40, 50, 70 made of impact-resistant material, such as acrylate, aluminum and/or stainless steel, may be provided that incorporates one or more of the aspects of the present invention. Modifications, such as thickened 42 lead edge or open end 25, or openings or cutouts 31-34 in the backwall 22 may be added in action 1004.

In action 1006, a hermetically sealed glass assembly 1, 80, 90, 100, 110, such as a frit-sealed OLED device 1 for an OLED display, that may incorporate one or more of the aspects of the present invention as described in relation to FIGS. 9-14 is provided that is sized to fit within the bezel.

In action 1008, as an intermediate layer of backing material 64 with a low elastic modulus may be adhered to the glass package 1, 80, 90, 100, 110 or to the backwall 22 of the bezel 10, 20, 30, 40, 50, 70. Alternatively, the backing material may simply be placed in the bezel, and be trapped between the glass package and the bezel in the next step.

In action 1010, a bonding agent or adhesive 62, 62a is used to hold the sealed device 1 tightly to the bezel 10. The organic adhesive may be allowed or caused to penetrate and partially fill the gap 66.

In action 1012, as necessary, the bonding agent or adhesive is enabled, allowed and/or caused to set or cure, such as through passage of time or application of ultraviolet light.

In step 1014 a cover 52 according to an aspect of the present invention is formed.

In step 1016, the cover 52 is attached to the bezel, such as, for example, with adhesive, interference/snap fit or mechanical fasteners.

The bezel/glass package assembly is now ready to be assembled into a final end product. In the case of the glass package being an OLED display panel, the bezel/glass package assembly may by assembled into a cell phone, PDA, television, digital camera, music player, multi-media device, or any other end product that employs a display panel.

Although the invention herein has been described with respect to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A bezel for packaging a sealed glass assembly comprising:
    a bezel having a rectangular back wall with first, second, third and fourth peripheral edges; first, second and third sidewalls extending upward from the first, second and third peripheral edges respectively, with the sidewalls being joined together at two corners of the backwall;
    the bezel including at least one of (a) a reinforcing structure along the fourth peripheral edge of the bezel backwall; (b) rounded corners (c) chamfered corners; and (c) at least one opening through the backwall;
    a sealed glass assembly comprising first and second rectangular glass plates including one of rounded or chamfered corners, wherein the first glass plate is longer in one dimension than the second glass plate, whereby a portion of the first glass plate extends beyond the second glass plate a distance that is about 0.1 to about 5% of the diagonal of the second glass plate; an element that is sensitive to heat and to at least one of moisture and the ambient atmosphere located between the first and second glass plates, the element comprising at least one electronic device; and a glass frit sealing material extending between the first and second plates and surrounding the element, the frit sealing material thereby joining the first and second glass plates and substantially hermetically sealing the element in the glass assembly, and electrical leads located on the extending portion of the first glass plate and extend through the frit seal to the at least one electronic device without compromising the hermetic seal; and
    adhesive securing the sealed glass assembly in the bezel and forming a shock absorbent intermediate layer between the sealed glass assembly and the bezel.

2. A bezel for packaging a sealed glass assembly comprising:
    a bezel having a rectangular back wall with first, second, third and fourth peripheral edges; first, second and third sidewalls extending upward from the first, second and third peripheral edges respectively; and at least two rounded corners; the bezel further including mounting elements extending upward from an inner surface of the back wall;
    a sealed glass assembly; and
    a flexible mounting structure affixed to peripheral edges of the glass assembly and secured to the mounting elements such that the glass assembly and the flexible mounting structure are both spaced from and suspended over the back wall by the mounting elements to form a gap between the back wall and the glass assembly,
    wherein the flexible mounting structure comprises a flexible member having an end portion affixed to a peripheral edge of the glass assembly that is unrestrained above and below the end portion.

3. The bezel of claim 2, further comprising:
    a cover having a front wall with first, second, third and fourth peripheral edges; first, second and third sidewalls extending downward from the first, second and third peripheral edges respectively; the first, second and third cover sidewalls being connected to the first, second and third bezel sidewalls.

4. The bezel of claim 3, further comprising;
    an OLED device in the glass assembly; and
    an opening in the cover front wall through which light emitted by the OLED device may pass.

5. The bezel of claim 4, wherein the OLED device is an OLED display panel.

6. The bezel of claim 2, further comprising:
    a shock absorbent, low modulus of elasticity material in the gap.

7. The bezel of claim 6, wherein the shock absorbent material forms an intermediate layer that spans the gap and is adhered to the bezel back wall and to the sealed glass assembly.

8. The bezel of claim 7, wherein the shock absorbent intermediate layer is formed of foam, ceramic fiber cloth and/or low modulus of elasticity polymeric organic coating.

9. The bezel of claim 6, wherein the shock absorbent material forms an intermediate layer comprising at least one of a low modulus of elasticity ceramic fiber cloth, resin, polymer, rubber, or epoxy material.

10. The bezel of claim 9, wherein the shock absorbent intermediate layer has a modulus of elasticity of about 0.01 GPa to about 10 GPa.

11. The bezel of claim 2, further comprising an adhesive forming a shock absorbent layer between the sealed glass assembly and the bezel, wherein:
    the adhesive adheres a bottom surface of the sealed glass assembly to the inner surface of the bezel backwall.

12. The bezel of claim 11, wherein the adhesive comprises one of an epoxy, polymer, rubber or silicone adhesive.

13. The bezel of claim 12, wherein the adhesive has a modulus of elasticity of about 0.01 GPa to about 10 GPa.

14. The bezel of claim 2, further comprising an adhesive applied to one of the inner surface of the bezel backwall and a bottom surface of the sealed glass assembly, wherein:
    the adhesive comprises one or more strips of adhesive in a generally ring shaped or rectangular pattern; and
    a shock absorbent, low modulus of elasticity material is located inside the ring of adhesive between the glass assembly and the bezel backwall.

15. The bezel of claim 2, further the sealed glass assembly further comprises:
    a first and second rectangular glass plates having one of rounded or chamfered corners;

an element that is sensitive to heat and to at least one of moisture and the ambient atmosphere located between the first and second glass plates; and a glass frit sealing material extending between the first and second plates and surrounding the element, the frit sealing material thereby joining the first and second glass plates and substantially hermetically sealing the element in the glass assembly.

16. The bezel of claim 15, wherein:

the element is at least one electronic device;

the first glass plate is longer in one dimension than the second glass plate, whereby a portion of the first glass plate extends beyond the second glass plate a distance that is about 0.1 to about 5% of the diagonal of the second glass plate; and electrical leads are located on the extending portion of the first glass plate and extend through the frit seal to the at least one electronic device without compromising the hermetic seal.

17. The bezel of claim 16, wherein the at least one electronic device is an organic light emitting diode device.

18. The bezel of claim 2, wherein the bezel comprises acrylate, plastic, composite material, metal, aluminum, titanium alloy and/or stainless steel.

19. The bezel of claim 18, wherein the bezel comprises metal with a modulus of elasticity of about 60 GPa to about 200 GPa.

20. The bezel of claim 18, wherein the bezel comprises plastic with a modulus of elasticity of about 0.1 GPa to about 10 GPa.

21. The bezel of claim 2, wherein the bezel further comprises a reinforcing structure along the fourth peripheral edge of the bezel backwall.

22. The bezel of claim 21, wherein the bezel further comprises at least one opening through the bezel backwall.

23. The bezel of claim 22, further comprising:

a cover having a front wall with first, second, third and fourth peripheral edges; first, second and third sidewalls extending downward from the first, second and third peripheral edges respectively; the first, second and third cover sidewalls being connected to the first, second and third bezel sidewalls.

24. A bezel for packaging a sealed glass assembly comprising:

a bezel having a rectangular back wall with first, second, third and fourth peripheral edges; first, second and third sidewalls extending upward from the first, second and third peripheral edges respectively; and at least two rounded corners;

a sealed glass assembly comprising first and second rectangular glass plates including one of rounded or chamfered corners, wherein the first glass plate is longer in one dimension than the second glass plate, whereby a portion of the first glass plate extends beyond the second glass plate a distance that is about 0.1 to about 5% of the diagonal of the second glass plate; an element that is sensitive to heat and to at least one of moisture and the ambient atmosphere located between the first and second glass plates, the element comprising at least one electronic device; and a glass frit sealing material extending between the first and second plates and surrounding the element, the frit sealing material thereby joining the first and second glass plates and substantially hermetically sealing the element in the glass assembly, and electrical leads located on the extending portion of the first glass plate and extend through the frit seal to the at least one electronic device without compromising the hermetic seal; and an adhesive material securing the sealed glass assembly in the bezel and forming a shock absorbent layer between the sealed glass assembly and the bezel.

25. The bezel of claim 24, wherein the at least one electronic device is an organic light emitting diode device.

26. The bezel of claim 24, further comprising:

a cover having a front wall with first, second, third and fourth peripheral edges; first, second and third sidewalls extending downward from the first, second and third peripheral edges respectively; the first, second and third cover sidewalls being connected to the first, second and third bezel sidewalls.

27. The bezel of claim 26, wherein the at least one electronic device comprises an OLED device, and the cover includes an opening in the front wall of the cover through which light emitted by the OLED device may pass.

28. The bezel of claim 24, wherein the adhesive adheres an inner surface of the bezel sidewalls to peripheral edges of the glass assembly, with the glass assembly being spaced form the bezel backwall thereby forming gap between the glass assembly and the bezel backwall.

29. The bezel of claim 28, further comprising a shock absorbent, low modulus of elasticity material in the gap.

30. The bezel of claim 29, wherein the shock absorbent material forms an intermediate layer that spans the gap and is adhered to the bezel back wall and to the sealed glass assembly.

31. The bezel of claim 24, wherein:

the adhesive adheres a bottom surface of the sealed glass assembly to an inner surface of the bezel backwall.

32. The bezel of claim 31, wherein:

the adhesive comprises one or more strips of adhesive in a generally ring shaped or rectangular pattern; and a shock absorbent, low modulus of elasticity material is located inside the ring of adhesive between the glass assembly and the bezel backwall.

33. A bezel for packaging a sealed glass assembly comprising:

a bezel having a rectangular back wall with first, second, third and fourth peripheral edges; first, second and third sidewalls extending upward from the first, second and third peripheral edges respectively; and at least two rounded corners; the bezel further including mounting elements extending upward from an inner surface of the back wall;

a sealed glass assembly;

a flexible mounting structure affixed to peripheral edges of the glass assembly and secured to the mounting elements such that the glass assembly and the flexible mounting structure are both spaced from and suspended over the back wall by the mounting elements to form a gap between the back wall and the glass assembly, and an adhesive material forming a shock absorbent layer between the sealed glass assembly and the bezel, wherein the adhesive adheres a bottom surface of the sealed glass assembly to the inner surface of the bezel backwall.

* * * * *